United States Patent [19]

Suzuki et al.

[11] Patent Number: 5,021,998
[45] Date of Patent: Jun. 4, 1991

[54] SEMICONDUCTOR MEMORY DEVICE WITH LOW-HOUSE PADS FOR ELECTRON BEAM TEST

[75] Inventors: Yukihide Suzuki; Masaya Muranaka, both of Akishima; Masamichi Ishihara, Tokyo, all of Japan

[73] Assignees: Hitachi, Ltd., Tokyo; Hitachi VLSI Engineering, Kodaira, both of Japan

[21] Appl. No.: 339,843

[22] Filed: Apr. 18, 1989

[30] Foreign Application Priority Data

Apr. 28, 1988 [JP] Japan .................. 63-108748

[51] Int. Cl.$^5$ .............. G11C 5/02; G11C 8/00; G11C 7/00
[52] U.S. Cl. .................. 365/51; 365/230.03; 365/201
[58] Field of Search ............ 324/158 R, 158 T, 501, 324/508, 96; 365/51, 113, 119, 118, 128, 217, 237, 201, 230.03; 437/8

[56] References Cited

U.S. PATENT DOCUMENTS 4,628,590 10/1986 Udo et al. ................... 437/8
4,912,052 3/1990 Miyoshi et al. ................ 437/8

FOREIGN PATENT DOCUMENTS 56-96639 of 1982 Japan .

OTHER PUBLICATIONS

"Electron Beam Testing Symposium", in Nikkei Microdevice, Jan., 1987, pp. 34–37.

Primary Examiner—James W. Moffitt
Assistant Examiner—Jack A. Lane
Attorney, Agent, or Firm—Pennie & Edmonds

[57] ABSTRACT

Disclosed are measurement (observation) pads for judging whether or not a dynamic random access memory (DRAM) adopting a shared sense system is functioning as designed. Concretely, measurement pads are formed by the step of forming a second layer of wiring respectively connected to pairs of complementary data lines which are formed by the step of forming a first layer of wiring, and the signal waveforms of the pairs of complementary data lines are measured using the measurement pads. Further, the measurement pads are provided between wiring layers which become fixed potentials in, at least, the operation of measuring data. In addition, each of the measurement pads is used in common by data lines which are respectively connected to two memory cells located in different memory cell mats.

15 Claims, 5 Drawing Sheets

SEMICONDUCTOR MEMORY DEVICE WITH LOW-HOUSE PADS FOR ELECTRON BEAM TEST

BACKGROUND OF THE INVENTION

The present invention relates to a semiconductor memory device, and more particularly to techniques which are effective when applied to a semiconductor memory device wherein memory cells are arranged at the intersectional parts between data lines and word lines.

In a semiconductor memory device, for example, a dynamic random access memory (hereinbelow, abbreviated to "DRAM"), the signal waveforms of data lines, word lines, a reference clock signal line for RAS-group circuits, etc. are observed (measured). The observation is made in order to judge whether or not the DRAM is functioning as designed.

The observation is usually made with a probe tester by interposing an observational MOSFET between an observational pad and the signal line to-be-observed. In particular, the data line presents the signal waveform whose information is a minute amount of charges, so that the observational MOSFET is interposed lest the signal waveform should change due to the stray capacitance and resistance of a probe. The observational MOSFET has the signal line to-be-observed connected to its gate electrode, has a power source voltage (reference voltage) connected to its drain region, and has the observational terminal (pad) connected to its source region. The probe of the probe tester is brought into touch with the measuring terminal. That is, the observation is made in such a way that the operation of the observational MOSFET is controlled by the change of the signal waveform of the signal line, whereupon a voltage developed at the measuring terminal by the operation is detected by the probe. The observational MOSFETs and measuring terminals as stated above are arranged by utilizing so-called dead spaces such as the ends of the data lines, the ends of the word lines and the interspaces between circuits.

It is recently practiced to observe the signal waveforms of the data lines, the word lines etc. by the use of an electron beam (hereinbelow, abbreviated to "EB") tester. The observation with the EB tester features that, since the projection diameter of an electron beam is as small as about 0.1 [μm] by way of example, the signal waveform can be observed by directly projecting the electron beam on the signal line.

Incidentally, the EB tester is stated in, for example, NIKKEI MICRODEVICE, January 1987, pp. 34–37.

Besides, regarding a logic LSI which has multilayer wiring, means for effectively measuring the potential of a lower wiring layer with a low-acceleration SEM has been applied for a Japanese patent by the same assignee as in the present application (Japanese Patent Application No. 56-96639).

The specification of the above Japanese patent application states to the effect that the lower wiring layer is led out via the through hole of an inter-layer insulator film to an overlying observational pad, at which the signal waveform of the interior can be observed.

SUMMARY OF THE INVENTION

The inventor has found out that heightening the density of integration of the DRAM stated before is attended with the following problems:

When the density of integration is heightened, the data lines and word lines of the DRAM are laid out at very close intervals. In an area of such close intervals, the aforementioned measuring terminal of comparatively large size to be touched by the observational MOSFET and the probe cannot be located. This holds true also of the aforementioned reference clock signal line connected to the RAS-group circuits and other signal lines extended at the peripheral parts of the DRAM in adjacency to the former signal line. Accordingly, there has been the problem that the signal waveforms of the data lines, the word lines etc. in the area of the close intervals cannot be observed.

Moreover, when the density of integration is heightened, the influences of the stray capacitance and resistance of the probe of the probe tester increase to degrade the S/N (signal-to-noise) ratio of the signal waveform. Accordingly, there has been the problem that the observational precision of the signal waveforms of the data lines, the word lines etc. lower.

These problems can be solved using the EB tester stated before. More specifically, the EB tester irradiates each of the signal lines such as data lines and word lines laid out in the area of the close intervals, with the electron beam whose projection diameter is small as compared with the wiring width of the signal line, whereby the signal waveform of the signal line can be observed. In the semiconductor memory device such as DRAM, however, the data lines and the word lines are respectively extended in different directions and are therefore formed of different conductor layers with an inter-layer insulator film interposed therebetween. A DRAM under development by the inventor is constructed of a two-layer wiring (two-layer aluminum wiring) structure, in which data lines are formed of a lower wiring layer, while word lines (being shunt word lines) are formed of an upper wiring layer. Accordingly, as regards the word lines of the upper layer, the signal waveforms thereof can be precisely observed using the EB tester. As regards the data lines of the lower layer, however, the observation of the signal waveforms of the data lines with the EB tester incurs the problem of a low S/N ratio because the electron beam is scattered by the inter-layer insulator film.

It has therefore been studied that the data lines are -led out by an upper wiring layer via through holes and are measured by the EB tester. Since, however, the signal levels of the data lines of the DRAM have as very small values as 0.1 [V]–0.2 [V] by way of example, there is the problem that fluctuations in the potentials of the wiring lines formed around the leading-out upper wiring layer (or measuring pads) cause fluctuations in the signal levels of the measuring pads. Further, in measuring the signal levels of the data lines of the DRAM, the potentials of one pair of data lines (DL, $\overline{\text{DL}}$) are simultaneously measured, and either a high level (H) or a low level (L) is determined according to the difference of the potentials, thereby to judge if the DRAM is functioning as designed. This poses the problem that, in a case where the measuring pads for the data line DL and the data line $\overline{\text{DL}}$ are respectively affected by opposite potentials ascribable to the wiring layer formed around them, the decision of the high level (H) or the low level (L) errs. In this manner, in the DRAM or the like memory LSI having the complementary data lines, it is insufficient that the signal lines to-be-measured are merely led out by the overlying wiring layer so as to measure the signal levels thereof, and those places of the memory LSI in which the measuring terminals (pads) are arranged become very important.

The present invention has been made in order to solve the problems mentioned above, and it has for its object to provide, in a semiconductor memory device, techniques which permit signal waveforms in areas of close intervals to be observed at high precision.

The above and other objects and novel features of the present invention will become apparent from the description of this specification when read in conjunction with the accompanying drawings.

Typical aspects of performance of the present invention are briefly summarized as follows:

In a semiconductor memory device, measuring terminals for an EB tester which are formed of a final wiring layer above pairs of complementary data lines are respectively connected to the paired complementary data lines, and they are arranged among wiring layers which become fixed potentials in, at least, the operation of measuring data.

In addition, the measuring terminals for the EB tester are formed of the same conductor layer as that of word lines.

According to the expedients described above, the measuring terminal can be constructed in the smallest size for the connection to the corresponding data line (the projection diameter of an electron beam is still smaller than the size of the measuring terminal), and the measuring terminals can be arranged in an area where the data lines are closely laid out, so that the signal waveforms of the data lines in the close area can be measured, and besides, the electron beam is directly projected on the measuring terminals (an electron beam-scattering medium such as an inter-layer insulator film does not exist in a projection path), and the measuring terminals are not mechanically touched (a probe is not used), so that the measurement of the signal waveforms can be taken at a high S/N ratio.

Further, since the measuring terminals are disposed among the wiring layers which maintain fixed potentials in, at least, the data measuring operation, fluctuations in the potentials of the paired complementary data lines can be suppressed small. It is accordingly possible to enhance the measurement precision of the signals of the data lines.

Moreover, since the measuring terminals can be formed by the same manufacturing step as that of the word lines, the number of the manufacturing steps of the semiconductor memory device can be decreased in correspondence with the step of forming the measuring terminals.

DESCRIPTION OF THE PREFERRED EMBODIMENTS

Now, the construction of the present invention will be described in conjunction with embodiments in which the present invention is applied to a DRAM adopting the folded bit line organization.

Throughout the drawings for describing the embodiments, portions having identical functions are assigned the same symbols, and shall not be repeatedly explained.

Figure 1:
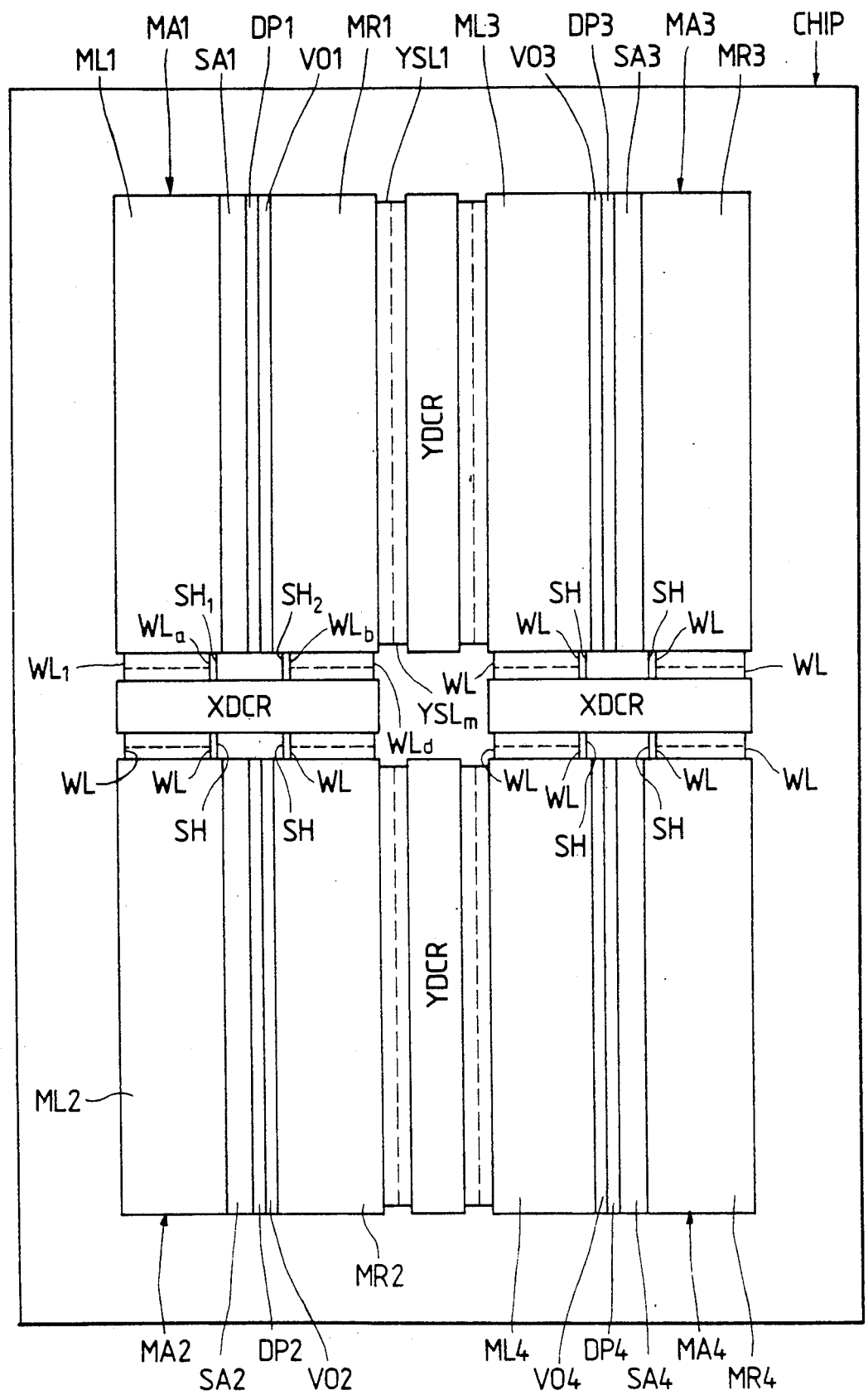
FIG. 1 is a block diagram showing the construction of a DRAM which adopts a shared sense system and which is an embodiment of the present invention.
Figure 2:
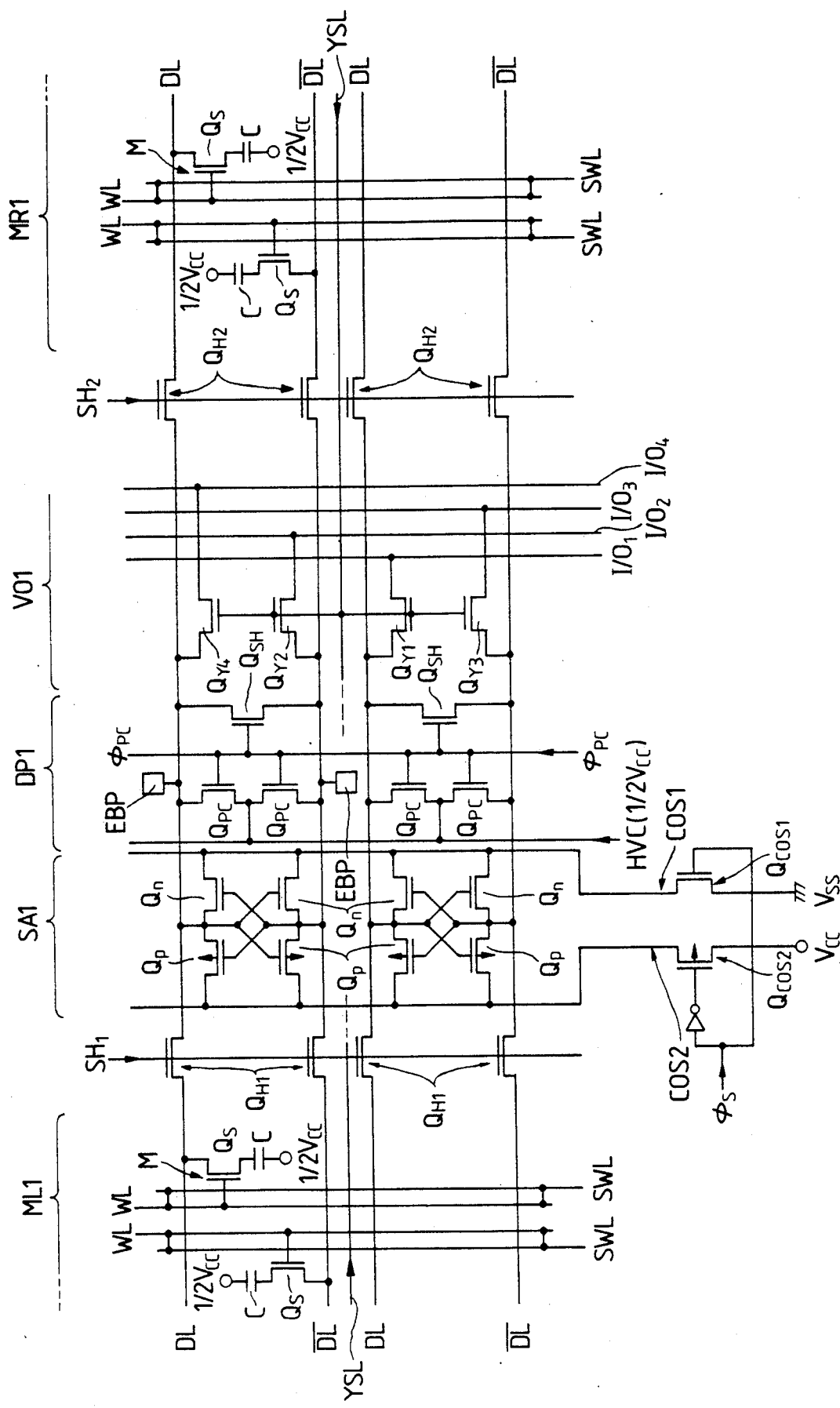
FIG. 2 is an equivalent circuit diagram of the essential portions of the DRAM in FIG. 1.

The construction of a DRAM which is one embodiment of the present invention is illustrated in FIG. 1 (a block diagram of an internal construction) and FIG. 2 (an equivalent circuit diagram of essential portions).

The DRAM of this embodiment is constructed in conformity with the folded bit line organization. As shown in FIG. 2, a plurality of memory cells M are arranged in the shape of a matrix within the memory cell array (memory cell mat) MA1 of the DRAM. In addition, memory cell mats MA2–MA4 each of which is constructed similarly to the memory cell mat MA1 are formed on an identical semiconductor chip CHIP. Hereinbelow, only the memory cell mat MA1 shall be representatively described in the concrete. The memory cells M are arranged at the intersectional parts between complementary data lines (complementary bit lines) DL, $\overline{DL}$ extending in parallel in a column direction and word lines WL extending in a row direction.

The DRAM is one of a so-called shared sense system. Because of the shared sense system, a sense amplifier circuit SA1, a precharge circuit DP1 and an input/output signal selector circuit VO1 are shared by divided memory cell mats ML1 and MR1.

As shown in FIG. 2, the sense amplifier circuit SA1, precharge circuit DP1 and input/output signal selector circuit VO1 are connected to the respective pairs of complementary data lines DL, $\overline{DL}$ laid in the row direction. The word lines WL are connected to the corresponding ones of the lines WL1–WLa or WLb–WLd of an X (column) decoder circuit XDCR shown in FIG. 1. Shunt word lines SWL extending in the row direction are laid at positions parallel to the word lines WL. The shunt word line SWL is short-circuited with the corresponding word line WL at predetermined parts (for example, every memory cell or every predetermined number of memory cells) so as to lower the specific resistance of the word line WL. In FIGS. 1 and 2, symbols SH1 and SH2 denote select signals for selecting the divided memory mats. In case of selecting the divided memory mat ML1, the memory mat select signal SH1 is maintained in the state of its high level (of, for example, 5 [V]) (to bring n-channel MISFETs $Q_{H1}$ into their "on" states), and the select signal SH2 is set at its low level (of, for example, 0 [V]) (to bring n-channel MISFETs $Q_{H2}$ into their "off" states). To the contrary, in case of selecting the divided memory mat MR1, the select signal SH2 is maintained at its high level, and the select signal SH1 is set at its low level.

As shown in FIG. 2, the memory cell M is constructed of a series circuit which consists of a memory cell selecting MISFET $Q_S$ and an information storing capacitor C. The memory cell selecting MISFET $Q_S$ is made up of an n-channel MISFET. One semiconductor region of the memory cell selecting MISFET $Q_S$ is connected to one of the complementary data lines DL and $\overline{DL}$. The other semiconductor region is connected to one electrode of the information storing capacitor C. The gate electrode of the MISFET $Q_S$ is connected to the word line WL. The other electrode of the information storing capacitor C is connected to a power source voltage ½ $V_{CC}$. The power source voltage ½ $V_{CC}$ is the middle potential (about 2.5 [V]) between a power source voltage $V_{CC}$, for example, the operating potential 5 [V] of circuitry, and a reference voltage $V_{SS}$, for example, the ground potential 0 [V] of the circuitry.

The precharge circuit DP1 is configured of two precharge MISFETs $Q_{PC}$ whose gate electronics are both connected to a precharge signal line $\phi_{PC}$, and a short-circuit MISFET $Q_{SH}$ whose gate electrode is similarly connected to the precharge signal line $\phi_{PC}$. Each of the precharge MISFETs $Q_{PC}$ has one semiconductor region thereof connected to the corresponding one of the complementary data lines DL and $\overline{DL}$, and has the other semiconductor region thereof connected to a reset signal line (at the power source voltage ½ $V_{CC}$) HVC. The semiconductor regions of the short-circuit MISFET $Q_{SH}$ are respectively connected to the complementary data lines DL and $\overline{DL}$. Each of the precharge MISFETs $Q_{PC}$ and shortcircuit MISFET $Q_{SH}$ is made up of an n-channel MISFET.

The sense amplifier circuit SA1 is configured of two n-channel MISFETs $Q_n$ and two p-channel MISFETs $Q_p$. One semiconductor region of each of the n-channel MISFETs $Q_n$ of the sense amplifier circuit SA1 is connected to the corresponding one of the complementary data lines DL and $\overline{DL}$, while the other semiconductor region thereof is connected to a common source line COS1. The gate electrodes of the respective n-channel MISFETs $Q_n$ are crossed to each other in such a manner that the gate electrode of each MISFET $Q_n$ is connected to the other data line opposite to one data line of the complementary data lines DL and $\overline{DL}$ to which one semiconductor region thereof is connected. One semiconductor region of each of the p-channel MISFETs $Q_p$ of the sense amplifier circuit SA1 is connected to the corresponding one of the data lines DL and $\overline{DL}$, while the other semiconductor region thereof is connected to a common source line COS2. Likewise to the above, the gate electrodes of the respective p-channel MISFETs $Q_p$ are crossed to each other in such a manner that the gate electrode of each MISFET $Q_p$ is connected to the other data line opposite to one data line of the complementary data lines DL and $\overline{DL}$ to which one semiconductor region thereof is connected.

Figure 4A:
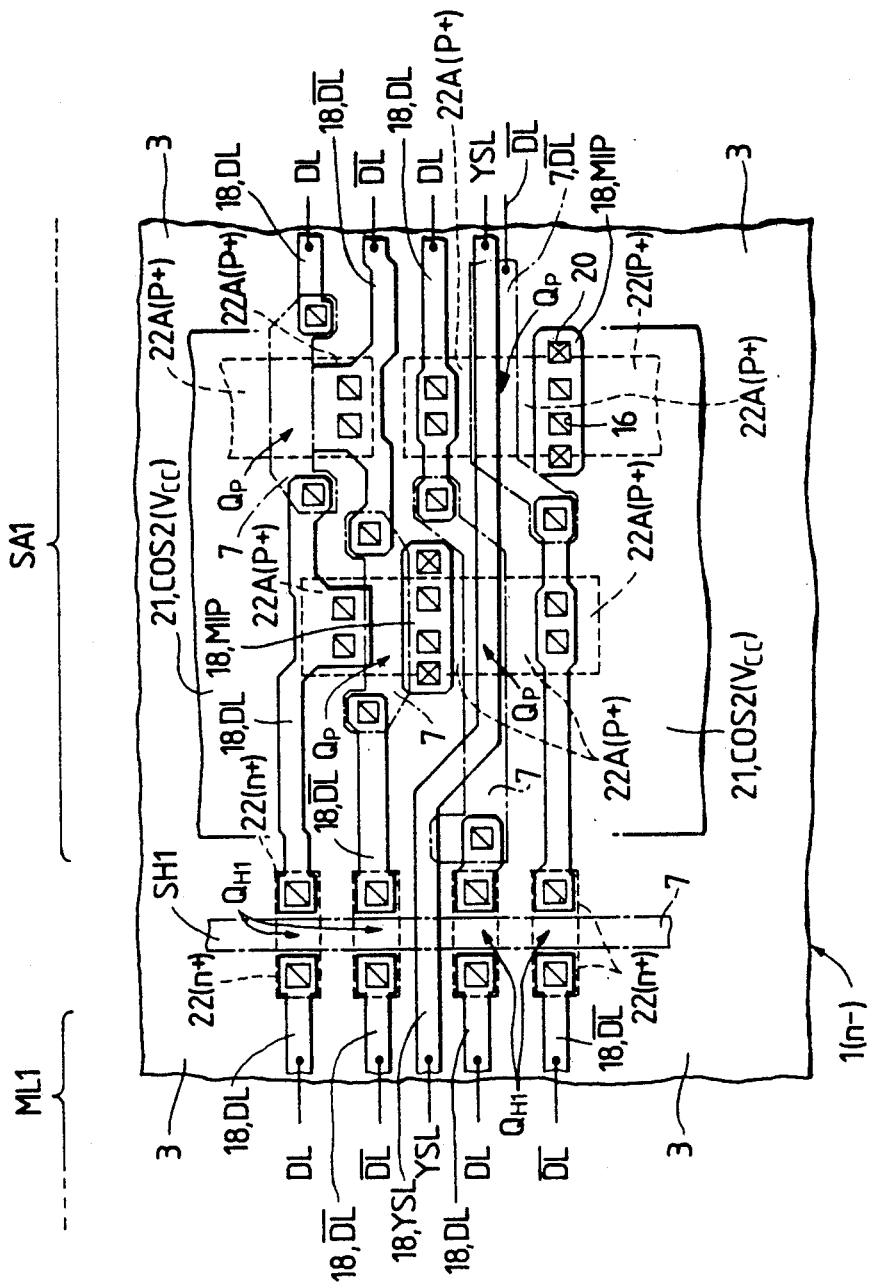
FIGS. 4A and 4B are layout diagrams showing the practicable arrangements of peripheral circuits in the DRAM, the peripheral circuits being laid out so that the right end of FIG. 4A and the left end of FIG. 4B may be substantially joined.
Figure 4B:
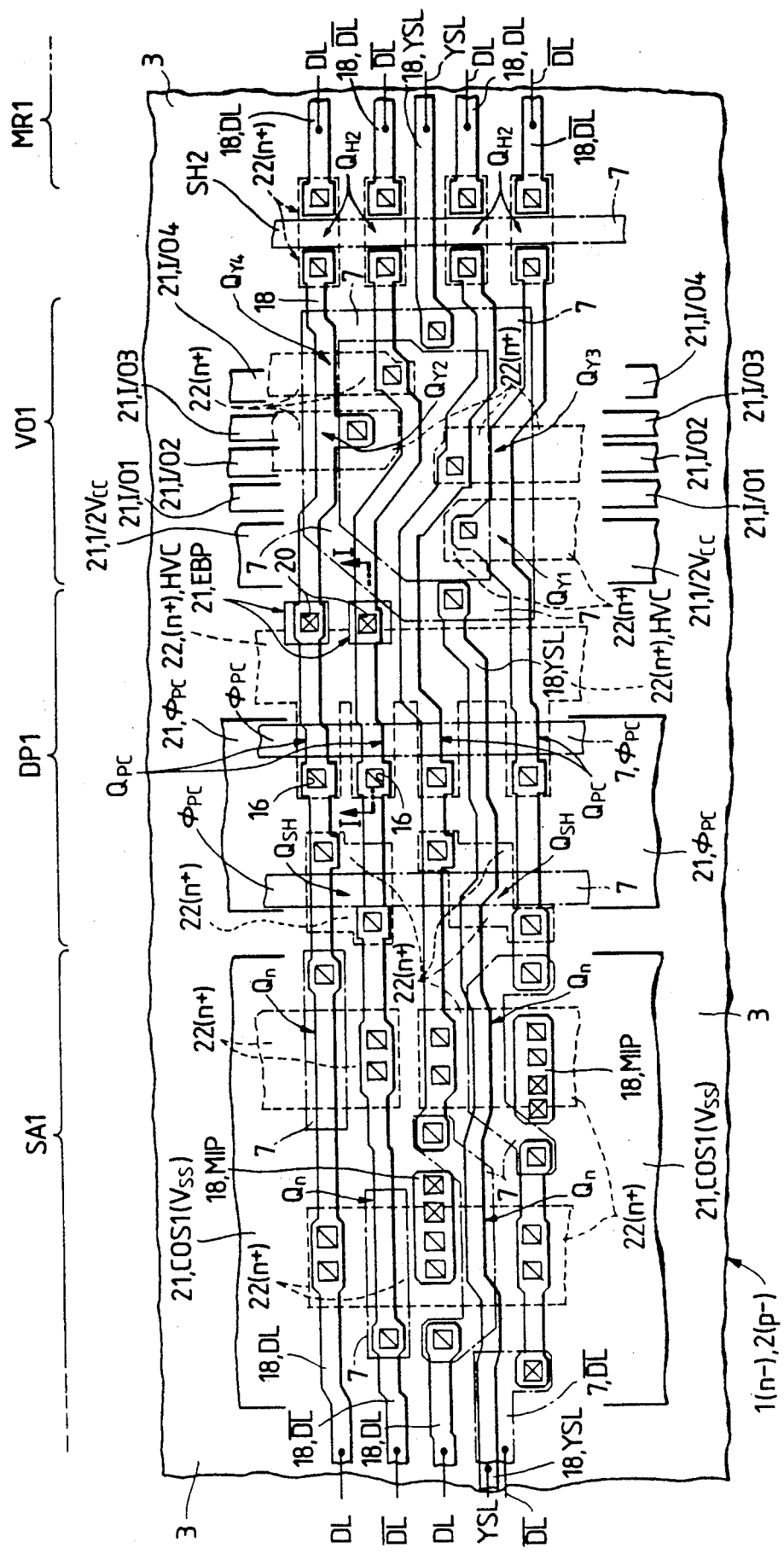

The common source lines COS1 and COS2 are respectively connected to the power source voltages $V_{SS}$ (0 [V]) and $V_{CC}$ (5 [V]) through MISFETs $Q_{COS1}$ and $Q_{COS2}$ which are controlled by a signal $\phi_S$. As shown in FIGS. 4B and 4A to be referred to later, the respective common source lines COS1 and COS2 are formed of a second wiring layer 21 so as to be wide enough to substantially cover an area for forming the sense amplifier circuit SA1. This is intended to prevent external noise from transferring to the data lines formed of a first wiring layer 18, thereby to avoid the distortions etc. of data signals.

The input/output signal selector circuit VO1 shown in FIG. 2 is configured of input/output selecting MISFETs (Y switches) $Q_{Y1}$-$Q_{Y4}$ which are formed of the n-channel type. Each of the input/output selecting MISFETs $Q_{Y1}$-$Q_{Y4}$ is arranged for the corresponding one of the complementary data lines DL and $\overline{DL}$. Besides, as shown in FIG. 4B, each of the input/output selecting MISFETs $Q_{Y1}$-$Q_{Y4}$ has one semiconductor region thereof connected to the complementary data line DL or $\overline{DL}$ and has the other semiconductor region thereof connected to the corresponding one of complementary input/output signal lines I/O$_1$-I/O$_4$ through predetermined parts of an intermediate conductor film MIP to be described later. A Y-select signal line YSL is connected to the gate electrodes 7 of the input/output selecting MISFETs $Q_{Y1}$-$Q_{Y4}$. The Y-select signal line YSL is connected to any of the lines YSL1 -YSLm of a Y (row) decoder circuit YDCR.

Next, the essential portions of the memory cell M and peripheral circuits will be briefly described with reference to FIG. 3 (a sectional view of the essential portions) and FIGS. 4A and 4B (plan views of the essential portions). Here, the left side of FIG. 3 corresponds to the memory cell M of the divided memory mat ML1 in FIG. 2, while the right side of FIG. 3 corresponds to the precharge MISFET $Q_{PC}$ of the precharge circuit DP1 in FIG. 2 and FIG. 4B. Incidentally, FIGS. 4A and 4B are layout diagrams corresponding to the circuit diagram shown in FIG. 2, and the right end of FIG. 4A and the left end of FIG. 4B are substantially continuous.

Figure 3:
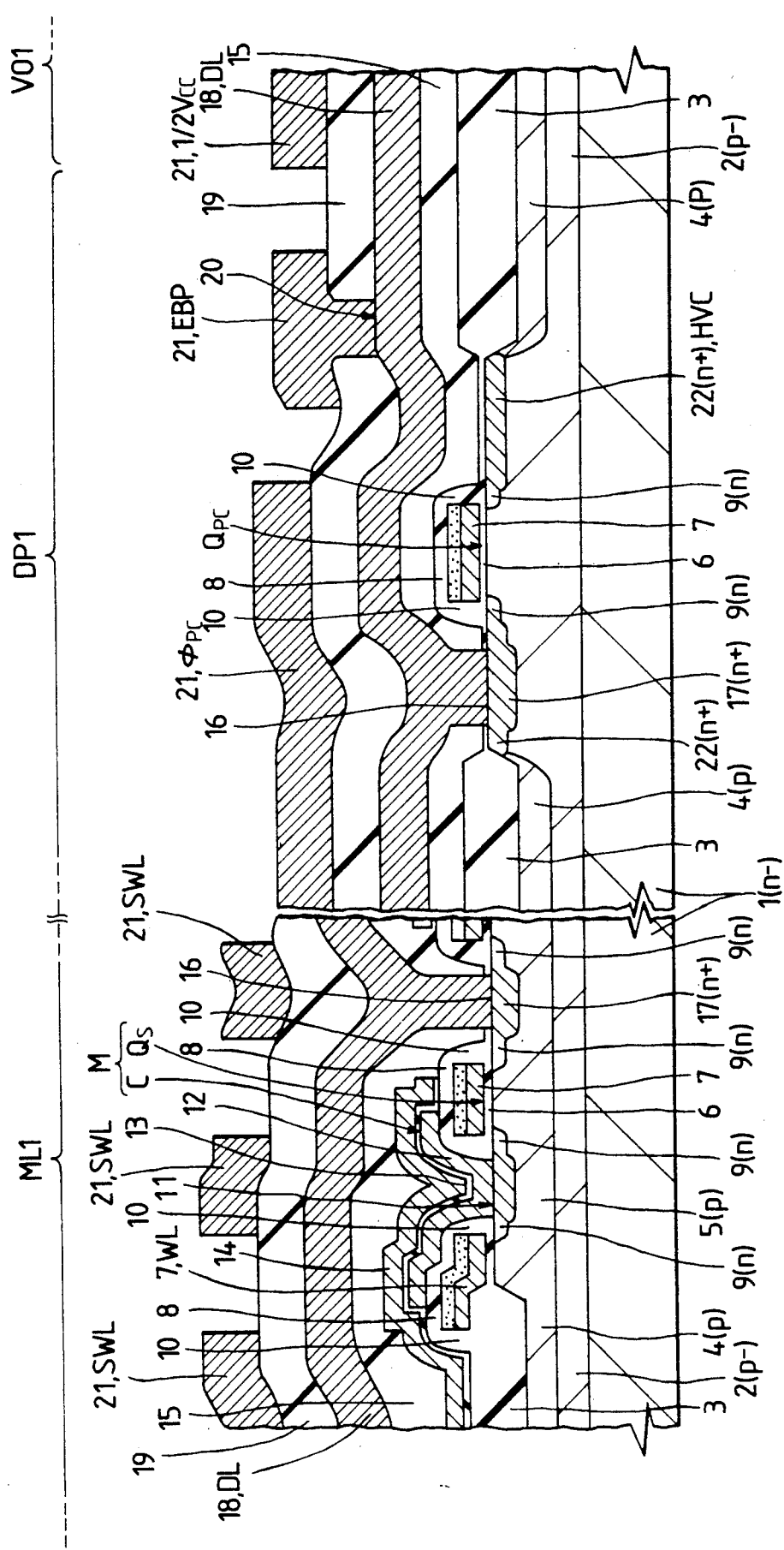
FIG. 3 is a sectional view of the essential portions of the DRAM, in which the left part corresponds to a divided memory cell mat (ML1) in FIG. 2, while the right part corresponds to a precharge circuit (DP1) in FIG. 2.

As shown in FIG. 3, the DRAM is constructed using an $n^-$-type semiconductor substrate 1 which is made of single-crystal silicon. In an area for forming n-channel MISFETs, a $p^-$-type well region 2 is provided in the principal surface part of the semiconductor substrate 1. Besides, although not shown in FIG. 3, an $n^-$-type well region is provided in the principal surface part of the semiconductor substrate 1 in an area for forming p-channel MISFETs as shown in FIG. 4A.

As illustrated on the left side of FIG. 3, the memory cell M of the DRAM shown in FIG. 2 is constructed on the principal surface of a p-type potential barrier region 5 within an area whose perimeter is defined by a field insulator film 3 and a p-channel stopper region 4. The potential barrier region 5 is provided in the principal surface part of the well region 2, and it forms a potential barrier against minority carriers which are generated by the entrance of alpha particles into the well region 2 and the semiconductor substrate 1. The field insulator film 3 and the channel stopper region 4 are formed so as to electrically isolate semiconductor elements from one another.

The memory cell selecting MISFET $Q_S$ of the memory cell M is mainly configured of the potential barrier region 5 (channel forming region), a gate insulator film 6, a gate electrode 7, and a pair of n-type semiconductor regions 9 serving as a source region and a drain region. In this embodiment, the gate electrode 7 is made up of a composite film in which a refractory metal silicide film is stacked on a polycrystalline silicon film, though not restricted to this gate material. The gate electrode 7 is integrally formed with a word line (WL) 7 which extends in the gate width direction thereof. The word line 7 is laid so as to extend on the field insulator film 3.

The information storing capacitor C is mainly configured of a lower electrode 12, a dielectric film 13 and an upper electrode (common plate electrode) 14 which are respectively stacked in succession. This information storing capacitor C is constructed of a so-called stacked capacitor structure (which is not restrictive, but which may well be replaced with a planar structure). The lower electrode 12 is connected to the other semiconductor region 9 of the memory cell selecting MISFET $Q_S$ through a contact hole 11 which is formed in a region defined by side-wall spacers 10. The lower electrode 12 is disposed every memory cell. It is formed of, for example, a polycrystalline silicon film. The dielectric film 13 is made of, for example, the single layer of a silicon nitride film or a silicon oxide film or a composite film consisting of them. The upper electrode 14 of the memory cell M is constructed integrally with that of the adjacent memory cell M. The upper electrode 14 has the power source voltage ½ $V_{CC}$ applied thereto as stated before. It is formed of, for example, a polycrystalline silicon film.

A data line (DL) 18 is connected to one semiconductor region 9 of the memory cell selecting MISFET $Q_S$ of the memory cell M through a contact hole 16 which is formed in an inter-layer insulator film 15. The connection between the semiconductor region 9 and the data line 18 is effected by interposing an n+-type semiconductor region 17 therebetween. The data line 18 is formed by the step of forming a first layer of wiring, and is made of, for example, aluminum alone or aluminum doped with Si or Cu. Alternatively, the data line 18 may well be made up of a composite film in which an aluminum film is underlaid or overlaid with a refractory metal silicide film.

The data line 18 is overlaid with shunt word lines (SWL) 21 through an inter-layer insulator film 19. Although no illustration is made, each shunt word line 21 has its predetermined parts once connected to an intermediate conductor film 18 (MIP) formed by the step of forming the first layer of wiring, through contact holes 20 formed in the inter-layer insulator film 19. The intermediate conductor film MIP is connected to the word line 7 through the contact hole 16. That is, the shunt word line 21 is electrically short-circuited with the word line 7. The shunt word line 21 is formed by the step of forming a second layer of wiring (the step of forming final wiring), and is made of, for example, the same material and structure as those of the wiring formed by the step of forming the first layer of wiring. In addition, the intermediate conductor film MIP is used in cases of connecting the second layer of wiring 21 and semiconductor regions 22, 22A.

FIGS. 4A and 4B show the n-channel MISFETs $Q_n$ and p-channel MISFETs $Q_p$ of the sense amplifier circuit SA1 illustrated in FIG. 2, the precharge MISFETs $Q_{PC}$ and short-circuit MISFETs $Q_{SH}$ of the precharge circuit DP1, the complementary input/output signal lines I/O of the input/output signal selector circuit VO1, and the MISFETs $Q_{H1}$ and $Q_{H2}$ for selecting the divided memory mats ML1 and MR1. Besides, in FIGS. 4A and 4B, marks □ and ▫ denote contact parts, in which the part □ is the connection node between the first layer of wiring 18 and the semiconductor region 22 or 22A or the connection node between the first layer of wiring 18 and the gate electrode 7, while the part ▫ is the connection node between the first layer of wiring 18 and the second layer of wiring 21. Further, in these figures, an area enclosed with a broken line (---) is an element forming area defined by the field insulator film 3, a dot-and-dash line (-·-) indicates the pattern of the gate electrode 7, and a solid line () designates the first layer of wiring or the second layer of wiring. The right side of FIG. 3 (corresponding to a section taken along cutting-plane line I—I in FIG. 4B) shows the precharge MISFET $Q_{PC}$ of the precharge circuit DP1 among the peripheral circuits. This precharge MISFET $Q_{PC}$ and the n-channel MISFETs of the other peripheral circuits are constructed of substantially the same structure as that of the memory cell selecting MISFET $Q_S$ described above. That is, each of the precharge MISFET $Q_{PC}$, etc. is configured of a well region 2 (channel forming region), a gate insulator film 6, a gate electrode 7, and a pair of n-type semiconductor regions 9 and a pair of n+-type semiconductor regions 22 which constitute a source region and a drain region. These MISFETs are constructed of the lightly doped drain (LDD) structure. The data line 18 extending in the memory cell array MA1 is spread and laid on the precharge MISFET $Q_{PC}$ and other MISFETs of the peripheral circuits. A common source line (COS1) 21 is extended on the n-channel MISFETs $Q_n$ of the sense amplifier circuit SA1 and the short-circuit MISFETs $Q_{SH}$ of the precharge circuit DP1 through the data lines 18. In addition, a precharge signal line ($\phi_{PC}$) 21 is extended on the precharge MISFETs $Q_{PC}$ of the precharge circuit DP1 through the data lines 18. The precharge signal line ($\phi_{PC}$) 21 has its predetermined parts shortcircuited with precharge signal lines ($\phi_{PC}$) 7 which underlie the precharge signal line ($\phi_{PC}$) 21 and which are formed integrally with the gate electrodes 7 of the precharge MISFETs $Q_{PC}$. Besides, the complementary input/output signal lines (I/O) 21 and a power source voltage line (½ $V_{CC}$) 21 are extended over the data lines 18 in the area of the input/output signal selector circuit VO1.

The power source voltage line (½ $V_{CC}$) 21 is laid along the right sides of measuring terminals EBP for an EB tester as shown in FIG. 4B and to be described later, and it prevents coupling noise from entering the measuring terminals EBP from the surrounding wiring.

Among numerals indicated on the right side of FIG. 3 and in FIGS. 4A and 4B, the same ones as symbols indicated on the left side of FIG. 3 designate portions which are formed by identical manufacturing steps. That is, the layers of numeral 18 indicated on the right side of FIG. 3 and in FIGS. 4A and 4B are formed by the manufacturing step identical to that of the data lines 18 of the memory cell array MA1, and the layers of numeral 21 are formed by the manufacturing step identical to that of the shunt word lines 21.

In FIG. 4A, there are also shown p-channel MISFETs $Q_p$ having gate electrodes 7 which are formed by the same manufacturing step as that of the gate electrodes of the foregoing n-channel MISFETs $Q_n$. Each of the MISFETs $Q_p$ includes a p+-type semiconductor region 22A as its source or drain region. These MISFETs $Q_p$ are the MISFETs $Q_p$ of the sense amplifier circuit SA1 shown in FIG. 2.

In the DRAM thus constructed, the EB tester measurement terminals or pads (EBP) 21 are arranged as shown on the right side of FIG. 3 and in FIG. 4B. The EB tester measurement terminals 21 are connected to the predetermined data lines 18 through contact holes 20 which are formed in the inter-layer insulator film 19. They are formed by that step of forming the second layer of wiring which is the step of forming the final wiring. Since the projection diameter of the electron beam of the EB tester is as very small as about 0.1 [μm], the EB tester measurement terminal 21 can be constructed with the smallest working dimension or a small size near it. More specifically, the EB tester measurement terminal 21 can be constructed with a size which is obtained by adding to the size (opening dimensions) of the contact hole 20, the magnitude of the mask misregistration between the contact hole 19 and the data line 18 at the manufacturing steps thereof and the magnitude of the mask misregistration between the contact hole 19 and the EB tester measurement terminal 21. Assuming by way of example that the smallest working dimension is 1.0 [μm] and that the magnitudes of the mask misregistrations are 0.5 [μm], the EB tester measurement terminal 21 can be constructed with dimensions of about 3.0 ×3.0 [μm].

Fundamentally, the EB tester measurement terminals 21 may be provided at any positions of the data lines 18. Since, however, the shunt word lines 21 are densely laid out of the same conductor layer as that of the measurement terminals 21 in the memory cell array MA1, these terminals 21 are provided over the peripheral circuits. Another reason why the EB tester measurement terminals 21 are provided within the area of the peripheral circuits (SA1, DP1 and VO1) interposed between the divided memory mats ML1 and MR1, is as follows: By utilizing the fact that the peripheral circuits (SA1, DP1 and VO1) can be shared by the divided memory mats ML1 and MR1, also the EB tester measurement terminals 21 connected to the data lines 18 can be shared by the divided memory mats ML1 and MR1, and hence, the number of the measuring terminals 21 can be decreased to half. In consequence, the layout area of the measuring terminals 21 can be decreased, so that the density of integration of the DRAM can be heightened. Also over the peripheral circuits, the reset signal line 21, precharge signal line 21, complementary input/output signal lines 21, power source voltage lines 21, etc. are densely laid out of the same conductor layer. Therefore, it does not hold true that the EB tester measurement terminals 21 may be arranged in any place of the dense layout. In this embodiment, accordingly, the EB tester measurement terminals 21 are arranged by utilizing some interspace on the data lines 18 between the precharge signal line 21 or reset signal line HVC and the power source voltage line 21. The EB tester measurement terminal 21 need not be disposed for each of the data lines 18 juxtaposed in the row direction, but it may be disposed every predetermined number of data lines (for example, two measuring terminals may be disposed in correspondence with four pairs of complementary data lines DL, $\overline{DL}$).

As shown in FIG. 3 and FIG. 4B, the EB tester measurement terminals 21 are interposed between the power source voltage line 21 ($\frac{1}{2}$ $V_{CC}$) which is held at the fixed potential and the precharge signal line 21 ($\phi_{PC}$) or reset signal line HVC which becomes a fixed potential in, at least, the operation of observing data. Therefore, the measuring terminals 21 are less susceptible to the potential fluctuation of the other wiring layer during the measurement of the data, so that the measurement accuracy of the data can be enhanced. Moreover, the respective measuring terminals 21 connected to the pair of complementary data lines DL and $\overline{DL}$ are substantially square in structure and have sizes substantially equal to each other. Therefore, even when the individual measuring terminals 21 have received coupling noise from the surrounding wiring lines, the degrees of the influences of the noise become substantially equal in both the measuring terminals 21, so that the measured value of the data is hardly changed.

In this manner, in a DRAM, measuring terminals 21 for an EB tester are connected to, at least, data lines 18, the EB tester measurement terminals being formed of a final wiring layer which lies above the data lines, whereby the EB tester measurement terminals 21 can be constructed with the smallest size for the connection to the data lines 18 (the projection diameter of an electron beam is still smaller than the measurement terminal), and they can be arranged in a dense area in which the data lines 18 are laid out, so that the signal waveforms of the data lines 18 in the dense area can be measured, and besides, the EB tester measurement terminals 21 are directly irradiated with the electron beam (owing to the final wiring layer, an electron beamscattering source such as inter-layer insulator film does not exist in an irradiation path), and they are not mechanically touched (noncontacting type in which a probe is not used), so that the measurement of the signal waveforms can be performed at a high S/N ratio.

Since shunt word lines (SWL) 21 formed of the final wiring layer are connected to word lines (WL) 7, they can be used as EB tester measurement terminals for the word lines. As stated above, the projection diameter of the electron beam is small, so that the signal waveforms of the word lines can be satisfactorily measured within the wiring width dimension of the shunt word lines 21.

In addition, since the EB tester measurement terminals are arranged among the wiring layers of fixed potentials during, at least, the measurement of data, noise from surrounding wiring lines can be reduced, and hence, the measurement accuracy of the data can be enhanced. Moreover, since the common EB tester measurement terminals can be shared by the measurements of signals read out from the memory cells of two different memory mats, the number of the EB tester measurement terminals can be decreased, and hence, the density of integration of the DRAM can be heightened.

Besides, the EB tester measurement terminals 21 are formed of the same conductor layer as that of the shunt word lines 21 (an inter-layer insulator film 19 is also formed by the same manufacturing step), whereby the number of the manufacturing steps of the DRAM can be decreased in correspondence with the manufacturing step for forming the EB tester measurement terminals 21.

The observation (measurement) of the signal waveforms with the EB tester is carried out before a passivation film (not shown) is formed on the final wiring layer (21), or it is carried out through openings formed in the passivation film after this passivation film has been formed.

By the way, although not shown in the drawings, EB tester measurement terminals 21 are also provided in a dense area other than that of the data lines 18, for example, for the reference clock signal line (a first wiring layer) of RAS-group circuits.

The EB tester measurement terminals 21 may well be provided in a sparse area different from the dense areas.

Although, in the above, the invention made by the inventor has been concretely described in conjunction with embodiments, it is a matter of course that the present invention is not restricted to the foregoing embodiments, but that it can be variously altered within a scope not departing from the purport thereof.

By way of example, the present invention may well be such that the shunt word lines (or the word lines) of the DRAM are formed by the step of forming a first layer of wiring, that the data lines thereof are formed by the step of forming a second layer of wiring (a final wiring layer), and that EB tester measurement terminals connected to the shunt word lines are constructed.

In addition, the present invention is also applicable to a case where the data lines or word lines are formed of a gate material or semiconductor regions (diffused layers). That is, the present invention connects these data lines or word lines to EB tester measurement terminals formed of the final wiring layer.

Besides, the present invention is not restricted to the DRAM, but it can be extensively applied to semiconductor memory devices having data lines and word lines, such as a MOS type semiconductor memory device including static random access memory (SRAM), and a bipolar transistor type semiconductor memory device.

What is claimed is:

1. A semiconductor memory device comprising:
   (a) a semiconductor substrate having a main surface;
   (b) a memory array including a plurality of memory cells formed on a first area of said main surface of said semiconductor substrate;
   (c) a peripheral circuit formed on a second area of said main surface adjacent to said first area;
   (d) a plurality of complementary data line pairs formed over said memory array and being extended from said first area to said second area, wherein each of said complementary data line pairs is formed of a first level conductive layer;
   (e) an insulating film formed over said first and second areas so that said insulating film extends over said complementary data line pairs;
   (f) a plurality of word lines formed over said memory array and being extended on said insulating film, wherein each said work line is formed of a second level conductive layer which is a relatively higher level layer than that of said complementary data line pair with respect to said main surface of said substrate, and wherein said word lines and said complementary data line pairs couple to said memory cells; and
   (g) pad electrodes for measuring potentials of at least one said complementary data line pair by using an electron beam tester, being disposed on said insulating film, wherein said pad electrodes are disposed over said complementary data line pairs which extend in said second area of said main surface, and wherein said pad electrodes are formed of the same level conductive layer as that of said word line respectively and are electrically connected to the corresponding complementary data line pair via contact holes formed in said insulating film.

2. The semiconductor memory device according to claim 1, wherein said pad electrodes are directly contacted to said complementary data line pair respectively.

3. The semiconductor memory device according to claim 1, further comprising a first voltage source line for supplying an operation voltage to said semiconductor memory device, wherein said peripheral circuit includes a sense amplifier circuit which is formed in said second area of said main surface and is connected to said complementary data line pairs, and wherein said first voltage source line is formed of the same level conductive layer as that of said word lines and is disposed over said sense amplifier circuit.

4. The semiconductor memory device according to claim 3, wherein said first voltage source line is disposed so as to cover said sense amplifier circuit.

5. The semiconductor memory device according to claim 3, further comprising a second voltage source line for supplying an operation voltage to said semiconductor memory device, wherein said second voltage source line is formed of the same level conductive layer as that of said word lines and is disposed on said insulating film over said second area, and wherein said pad electrodes are arranged between said first and second voltage source lines respectively.

6. The semiconductor memory device according to claim 1, wherein each said complementary data line pairs of said first level conductive layer is made of a material whose principal component is an aluminum.

7. The semiconductor memory device according to claim 6, wherein each said word lines and each of said pad electrodes are made of a material whose principal component is an aluminum respectively.

8. The semiconductor memory device according to claim 7, wherein each said pad electrode has a configuration which is substantially square.

9. The semiconductor memory device according to claim 1, further comprising an insulating layer with contact holes formed between said memory array and said complementary data line pairs, wherein said complementary data line pairs are connected to the corresponding memory cells of said memory array via said contact holes in said insulating layer.

10. The semiconductor memory device according to claim 9, wherein each said memory cell comprises an n-channel MOSFET and a capacitor element connected to said n-channel MOSFET in series.

11. The semiconductor memory device according to claim 10, wherein said n-channel MOSFET comprises a gate electrode, a source region and drain region, and wherein said gate electrode is connected to the corresponding word line.

12. The semiconductor memory device according to claim 10, wherein each said memory cell is a memory cell of a dynamic random access memory.

13. A semiconductor memory device comprising:
   (a) a semiconductor substrate having a main surface;
   (b) a first memory mat including a plurality of first memory cells formed on said main surface;
   (c) a second memory mat including a plurality of second memory cells formed on said main surface;
   (d) a peripheral circuit formed on said main surface between said first and second mats, said peripheral circuit being a common peripheral circuit for said first and second memory mats;
   (e) a plurality of complementary data line pairs formed over said first and second memory mats so that each said complementary data line pair extends from over said first memory mat to over said second memory mat, each of said complementary data line pairs is formed of a first level conductive layer, wherein said first and second memory cells are coupled to the corresponding complementary data line pairs;
   (f) an insulating film formed over said complementary data line pairs; and
   (g) pad electrodes for measuring potentials of at least one of said complementary data line pairs by using an electron beam tester, being disposed on said insulating film over said peripheral circuit, wherein each of said pad electrodes is formed of a second level conductive layer other than that of said first level conductive layer with respect to said main surface, and wherein said pad electrodes are electrically connected to the corresponding data line pair via contact holes formed in said insulating film.

14. The semiconductor memory device according to claim 13, further comprising a first voltage source line for supplying an operation voltage to said memory device, wherein said peripheral circuit includes a sense amplifier circuit which is coupled to said complementary data line pairs, and wherein said first voltage source line is formed of the same level conductive layer as that of said pad electrodes and is disposed over said sense amplifier circuit.

15. The semiconductor memory device according to claim 14, wherein said first voltage source line is disposed so as to cover said sense amplifier circuit.

* * * * *

UNITED STATES PATENT AND TRADEMARK OFFICE
CERTIFICATE OF CORRECTION

PATENT NO.  : 5,021,998

DATED       : June 4, 1991

INVENTOR(S) : Yukihide Suzuki, et al.

It is certified that error appears in the above-identified patent and that said Letters Patent is hereby corrected as shown below:

On the title page, item [54], the title of invention should read:
--SEMICONDUCTOR MEMORY DEVICE WITH LOW-NOISE PADS FOR ELECTRON BEAM TEST--.

Signed and Sealed this

Seventeenth Day of March, 1992

Attest:

HARRY F. MANBECK, JR.

*Attesting Officer*  *Commissioner of Patents and Trademarks*